(12) United States Patent
Fang et al.

(10) Patent No.: US 10,998,856 B1
(45) Date of Patent: May 4, 2021

(54) CIRCUIT AND METHOD TO START A CRYSTAL OSCILLATOR

(71) Applicant: BESTECHNIC (SHANGHAI) CO., LTD., Shanghai (CN)

(72) Inventors: Fei Fang, Shanghai (CN); Lu Chai, Shanghai (CN)

(73) Assignee: BESTECHNIC (SHANGHAI) CO., LTD, Shanghai (CN)

( * ) Notice: Subject to any disclaimer, the term of this patent is extended or adjusted under 35 U.S.C. 154(b) by 0 days.

(21) Appl. No.: 17/076,698

(22) Filed: Oct. 21, 2020

(30) Foreign Application Priority Data

Jul. 14, 2020 (CN) .......................... 202010673460.6

(51) Int. Cl.
*H03B 5/32* (2006.01)
*G06F 1/10* (2006.01)
*G06F 1/06* (2006.01)
*H03K 5/24* (2006.01)

(52) U.S. Cl.
CPC ................. *H03B 5/32* (2013.01); *G06F 1/06* (2013.01); *G06F 1/10* (2013.01); *H03K 5/24* (2013.01)

(58) Field of Classification Search
CPC .... H03B 5/36; H03K 5/24; G06F 1/06; G06F 1/10
USPC .......................... 331/158, 46, 45, 57, 116 FE
See application file for complete search history.

(56) References Cited

U.S. PATENT DOCUMENTS 10,673,383 B2 * 6/2020 Powell ...................... H03L 7/10

* cited by examiner

*Primary Examiner* — Arnold M Kinkead
(74) *Attorney, Agent, or Firm* — Bayes PLLC

(57) ABSTRACT

Embodiments of circuits and methods for starting a crystal oscillator are disclosed herein. In one example, an oscillation circuit is disclosed. The oscillation circuit includes a multi-phase oscillator, a control circuit, a phase selection circuit, a drive circuit, and a crystal oscillator. The multi-phase oscillator is configured to generate candidate clock signals of multiple phases. The phase selection circuit is coupled to the multi-phase oscillator and configured to select a clock signal from the candidate clock signals. The drive circuit is coupled to the phase selection circuit and configured to inject the selected clock signal to the crystal oscillator for a period of time determined by the control circuit. The control circuit is coupled to the phase selection circuit and the drive circuit and is configured to control the on and off of the drive circuit and output a plurality of injections signals.

20 Claims, 8 Drawing Sheets

US 10,998,856 B1

CIRCUIT AND METHOD TO START A CRYSTAL OSCILLATOR

CROSS-REFERENCE TO RELATED APPLICATIONS

This application claims the benefits of priority to Chinese Patent Application No. 202010673460.6, filed on Jul. 14, 2020, which is incorporated herein by reference in its entirety.

BACKGROUND

Embodiments of the present disclosure relate to circuit and method to start a crystal oscillator.

In portable electronic devices, power consumption greatly affects the user experience of electronic devices due to limited battery power. The electronic device is not always in working mode but will wake up periodically; during the time that it is not awake, it is in a low-power sleep mode. The average power consumption of the device is mainly determined by the power consumption at wake-up, the length of time needed for wake-up, and the power consumption of sleep mode. The wake-up time is divided into the time needed for the crystal oscillator to stabilize and the operation time of the system. As a result, the shorter the time it takes for the crystal oscillator to stabilize, the shorter the system needs to wake up, and the lower the average power consumption of the system.

There are a few methods of accelerating the startup: one is to select the right current at startup to achieve the optimal drive circuit negative resistance. Thus, the optimal driving capacity will accelerate the startup. But the maximum negative resistance is limited by the crystal oscillator and its load capacitance. Therefore, this method has a limited capacity.

Another is to drive the two ends of the crystal oscillator directly at the startup time with a clock signal with a frequency close to the frequency of the crystal oscillator, hence rapidly enhancing the initial oscillation current of the crystal oscillator by injecting the clock signal into the crystal oscillator. However, this method requires that the driving clock signal has a frequency very close to the frequency of the crystal oscillator. Otherwise, the driving effect will be greatly reduced. Due to process bias, temperature, voltage, and other factors, it is not possible to ensure that the frequency of the driving clock signal is always very close to the frequency of the crystal oscillator. Therefore, the effect of this method can not be guaranteed.

SUMMARY

Embodiments of circuits and methods to start a crystal oscillator are disclosed herein.

In one example, an oscillation circuit is disclosed. The oscillation circuit includes a multi-phase oscillator, a phase selection circuit, a drive circuit, and a crystal oscillator. The multi-phase oscillator is configured to generate candidate clock signals of multiple phases. The phase selection circuit is coupled to the multi-phase oscillator, and the phase selection circuit is configured to select a clock signal from the candidate clock signals. The drive circuit is coupled to the phase selection circuit, and the drive circuit is configured to inject the selected clock signal to the crystal oscillator for a period of time determined by the control circuit. The control circuit is coupled to the phase selection circuit and the drive circuit, and the control circuit is configured to control the on and off of the drive circuit. The frequency of the multi-phase oscillator is configured to be calibrated according to the frequency of the crystal oscillator.

In another example, a method for starting a crystal oscillator is disclosed. The method includes generating candidate clock signals of multiple phases. The method also includes sending an initial injection signal to the crystal oscillator and receiving a feedback signal from the crystal oscillator. The method also includes generating a periodical injection signal and selecting a clock signal from the candidate clock signals by utilizing the feedback signal and the periodical injection signal. The method further includes injecting the selected clock signal to the crystal oscillator.

In still another example, a phase selection circuit configured to select a clock signal from candidate clock signals to start a crystal oscillator is disclosed. The phase selection circuit includes a comparator, a counter, an index circuit, and a multiplexer. The comparator is configured to convert a sine-wave feedback signal from the crystal oscillator to a square-wave feedback clock signal, and the square-wave feedback clock signal includes a start rising edge. The counter is coupled to the comparator, and the counter is configured to start counting upcoming rising edges of candidate clock signals from 1 to L after the start rising edge, where the L-th candidate clock signal is the selected clock signal. The index circuit is coupled to the counter, and the index circuit is configured to set the selected clock signal at high level. The multiplexer is coupled to the index circuit and a drive circuit, and the multiplexer is configured to send the selected clock signal to the drive circuit. The start rising edge is the first rising edge after the phase selection circuit receives a start signal.

This Summary is provided merely for purposes of illustrating some embodiments to provide an understanding of the subject matter described herein. Accordingly, the above-described features are merely examples and should not be construed to narrow the scope or spirit of the subject matter in this disclosure. Other features, aspects, and advantages of this disclosure will become apparent from the following Detailed Description, Figures, and Claims.

BRIEF DESCRIPTION OF THE DRAWINGS

The accompanying drawings, which are incorporated herein and form part of the specification, illustrate the presented disclosure and, together with the description, further serve to explain the principles of the disclosure and enable a person of skill in the relevant art(s) to make and use the disclosure.

Figure 1:
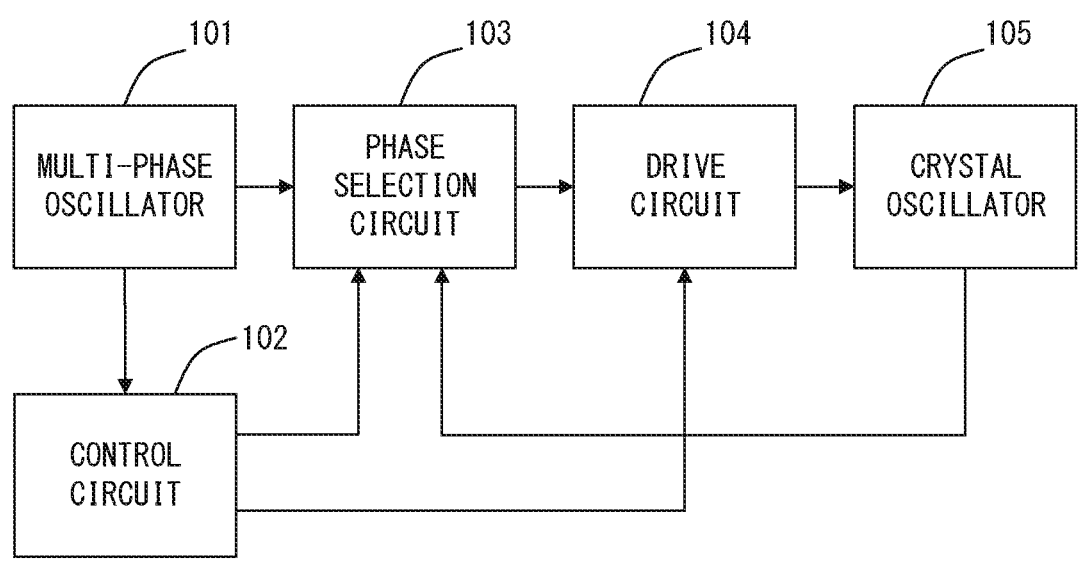
FIG. 1 is a block diagram illustrating an exemplary oscillation circuit to start a crystal oscillator in accordance with some embodiments.

The presented disclosure is described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

Although specific configurations and arrangements are discussed, it should be understood that this is done for illustrative purposes only. It is contemplated that other configurations and arrangements can be used without departing from the spirit and scope of the present disclosure. It is further contemplated that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure, or characteristic is described in connection with an embodiment, it is contemplated that such feature, structure, or characteristic may also be used in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Additional novel features will be set forth in part in the description which follows, and in part will become apparent to those skilled in the art upon examination of the following and the accompanying drawings or may be learned by production or operation of the examples. The novel features of the present disclosure may be realized and attained by practice or use of various aspects of the methodologies, instrumentalities, and combinations set forth in the detailed examples discussed below.

FIG. 1 is a block diagram illustrating an exemplary oscillation circuit to start a crystal oscillator in accordance with some embodiments. As illustrated in FIG. 1, oscillation circuit 100 can include a multi-phase oscillator 101, a control circuit 102, a phase selection circuit 103, a drive circuit 104, and a crystal oscillator 105. In some embodiments, multi-phase oscillator 101 is configured to generate candidate clock signals of multiple phases. Control circuit 102 is configured to output initial injection signal and periodical injection signal, and to control the on and off of the drive circuit 104. Phase selection circuit 103 is coupled to multi-phase oscillator 101 and control circuit 102 and is configured to receive candidate clock signals from multi-phase oscillator 101 and periodical injection signal from control circuit 102. Phase selection circuit 103 is configured to choose a candidate clock signal with an appropriate phase as a selected clock signal. Drive circuit 104 injects the selected clock signal to crystal oscillator 105 to start it. Multi-phase oscillator 101 can be a single-ended oscillator or a differential oscillator.

In some embodiments, control circuit 102 is configured to output the initial injection signal and periodical injection signal and control the on and off of the drive circuit 104. The initial injection signal and periodical injection signal can be generated by multi-phase oscillator 101, or they can be from outside of the oscillation circuit 100. Control circuit 102 is configured to control the period and times of injecting the periodical injection signal.

Figure 2:
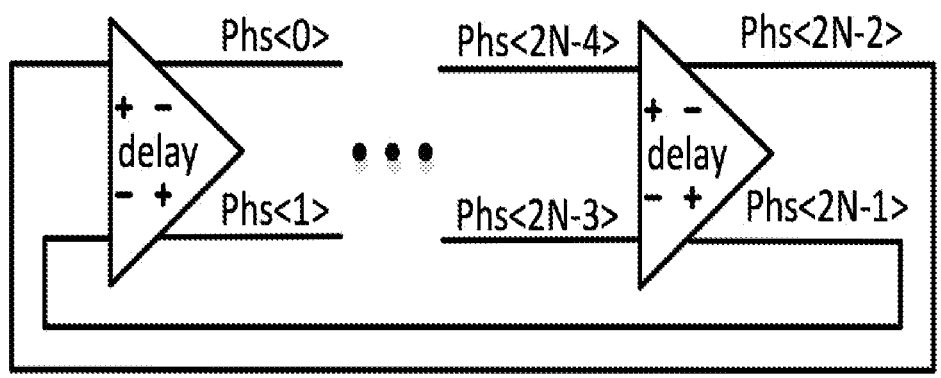
FIG. 2 is a block diagram illustrating an exemplary N-stage ring oscillator with N differential delay units in accordance with some embodiments.

FIG. 2 is a block diagram illustrating an exemplary N-stage ring oscillator with N differential delay units in accordance with some embodiments. As illustrated in FIG. 2, N-stage ring oscillator 200 can include N differential delay units, where N is a natural number. The N differential delay units form a closed loop. The frequency of the N-stage ring oscillator is determined by the delay time of each differential delay units; therefore, the frequency of the N-stage ring oscillator can be adjusted by adjusting the delay time of the differential delay units. The frequency of the N-stage ring oscillator is preferably adjusted close to the frequency of the crystal oscillator 105. In some embodiments, N is an odd number, and preferably 3, 5, or 7. In some embodiments, the frequency of the N-stage ring oscillator can be calibrated within an error of 0.5% compared to the frequency of the crystal oscillator.

In some embodiments, the N-stage oscillator includes N same differential delay units. Therefore, the N-stage ring oscillator generates 2N candidate clock signals with their phases equally spaced at 360/2N degree.

In some embodiments, the higher the frequency calibration accuracy of the multi-phase oscillator 101, the longer the injection time to the crystal oscillator 105 each time can be. When the frequency of the multi-phase oscillator 101 is close to the crystal oscillator 105, the phase error is less easy to accumulate. Therefore, the injection time can be longer each time, and fewer times of injection is needed.

Figure 3:
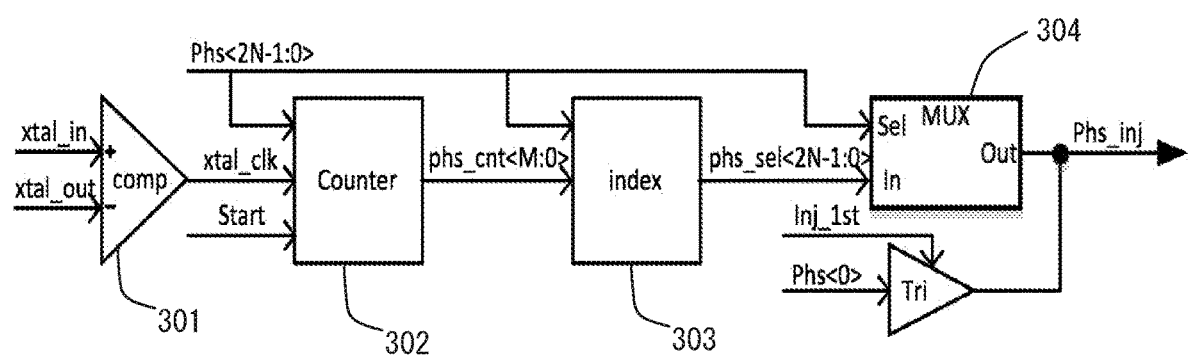
FIG. 3 is a block diagram illustrating an exemplary phase selection circuit in accordance with some embodiments.

FIG. 3 is a block diagram illustrating an exemplary phase selection circuit 300 in accordance with some embodiments. In some embodiments, phase selection circuit 300 includes comparator 301, counter 302, index circuit 303, and multiplexer 304.

In some embodiments, crystal oscillator 105 is configured to give a differential sine-wave feedback signal. Comparator 301 is coupled to crystal oscillator 105 and is configured to receive the sine-wave feedback signal from crystal oscillator 105. Comparator 301 is also configured to detect the phase of the sine-wave feedback signal and convert the feedback signal to a square-wave feedback clock signal. As illustrated in FIG. 3, xtal_in and xtal_out are a couple of differential sine-wave signals, and comparator 301 is configured to convert the sine-wave feedback signal to square-wave feedback clock signal xtal_clk.

In some embodiments, multi-phase oscillator 101 is an N-stage ring oscillator that is configured to generate 2N candidate clock signals with phases equally spaced at 360/2N degree. Control circuit 102 is configured to output a periodical injection signal as a start signal. Counter 302 is configured to receive xtal_clk signal from comparator 301, 2N candidate clock signals from multi-phase oscillator 101, and start periodical injection signal from control circuit 102. When control circuit 102 outputs start periodical injection at a high level, the first following rising edge of the square-wave feedback clock signal from comparator 301 triggers counter 302 to start to count upcoming rising edges of candidate clock signals from 1 to L. The L-th candidate clock signal is the selected clock signal with a proper phase. L is a natural number. In some embodiments, a 90-degree phase shifting is applied, which means that among phases of all candidate clock signals, the difference between the phase of the selected clock signal and the phase of the square-wave feedback clock signal is most close to 90 degrees. The equation can be expressed as $(L-1)*360/2N \leq 90° \leq L*360/2N$.

In some embodiments, the 90-degree phase-shifting is to off-set the delay caused by circuit components. Therefore, the phase-shifting may be set to another value other than 90 degrees according to the specific circuit.

In some other embodiments, an analog circuit can be utilized to convert the time difference between the rising edge of the square-wave feedback clock signal and the rising edges of candidate clock signals to voltage signal or current signal. A selected clock signal with proper phase can be chosen utilizing the voltage signal or current signal.

In some embodiments, index circuit 303 is configured to set the selected clock signal at a high level, and multiplexer 304 is configured to send the selected clock signal to drive circuit 104.

Figure 5:
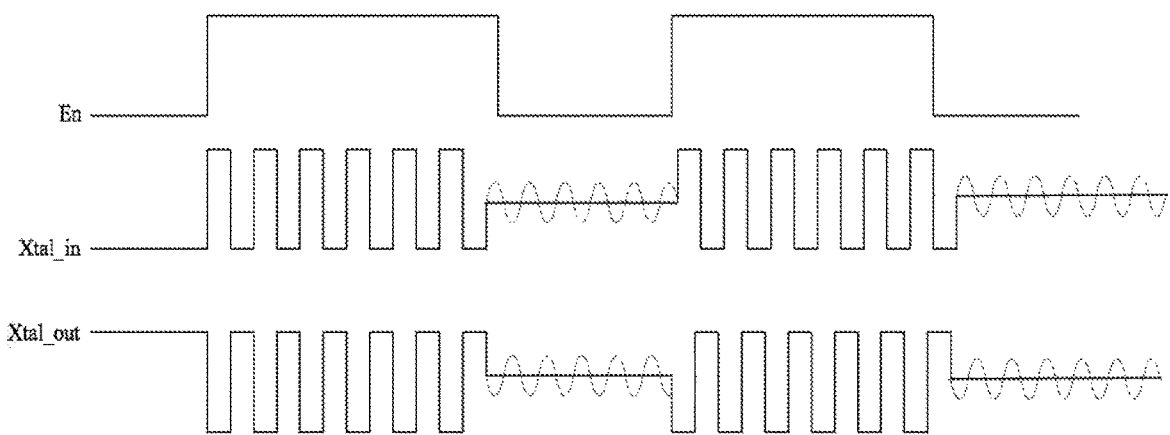
FIG. 5 is a sequence diagram illustrating the signal of the crystal oscillator and the enable signal of the drive circuit in accordance with some embodiments.

FIG. 5 is a sequence diagram illustrating the signal of the crystal oscillator and the enable signal of the drive circuit in accordance with some embodiments. The time duration of drive circuit 104 to be on and off is adjusted and determined by control circuit 102.

In some embodiments, the crystal oscillator 105 is a negative-feedback oscillation circuit. When drive circuit 104 is turned off, crystal oscillator 105 sends a feedback signal to phase selection circuit 103; phase selection circuit 103 then utilizes the feedback signal to select a candidate clock signal to inject into crystal oscillator 105. As illustrated in FIG. 5, sequence diagram 500 illustrates that when the enable signal is 0, drive circuit 104 is turned off, the feedback signal from crystal oscillator 105 is a sine-waive signal. When the enable signal is 1, drive circuit 104 is turned on, the feedback signal from crystal oscillator 105 is a square-wave signal. A couple of differential signals Xtal_in and Xtal_out are a pair of feedback signals from crystal oscillator 105.

In some embodiments, drive circuit 104 injects the initial injection signal or periodical injection signal to crystal oscillator 105. The signal amplitude of crystal oscillator 105 increases after the signal injection. Control circuit 102 determines the period of injecting signals and the times of injecting signals. When the signal amplitude of crystal oscillator 105 reaches a desired level, control circuit 102 will stop injecting signals to crystal oscillator 105.

Figure 7:
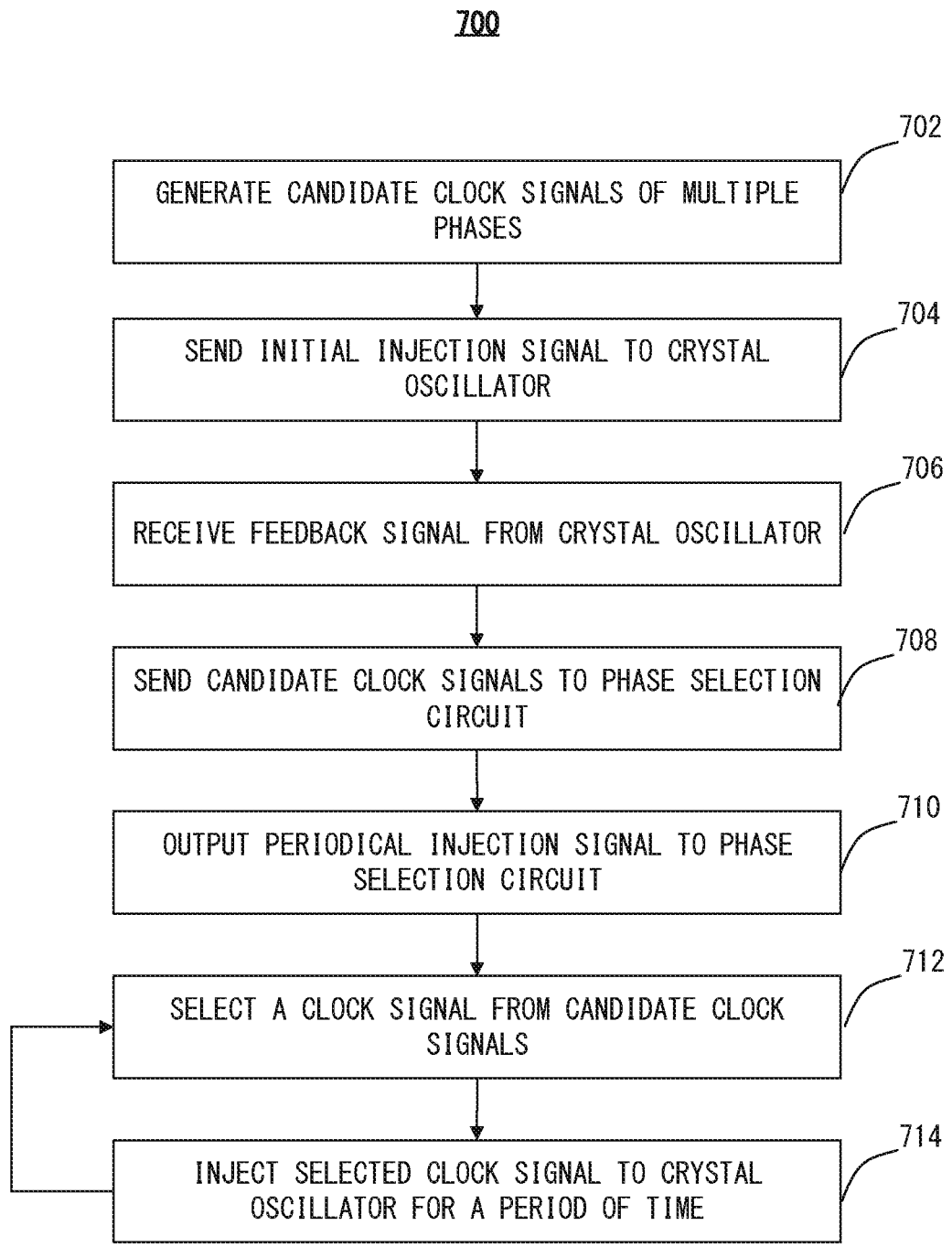
FIG. 7 is a flow chart illustrating an exemplary method for starting a crystal oscillator in accordance with some embodiments.

FIG. 7 is a flow chart illustrating an exemplary method 700 for starting a crystal oscillator in accordance with some embodiments. Method 700 can be performed by processing logic that can include hardware (e.g., circuitry, dedicated logic, programmable logic, microcode, etc.), software (e.g., instructions executed on a processing device), or a combination thereof. It is to be appreciated that not all operations may be needed to perform the disclosure provided herein. Further, some of the operations may be performed simultaneously, or in a different order than shown in FIG. 7, as will be understood by a person of ordinary skill in the art.

Method 700 shall be described with reference to FIGS. 1 and 3. However, method 700 is not limited to that exemplary embodiment. In method 700, the start of a crystal oscillator 105 is conducted by oscillation circuit 100.

Starting at step 702, candidate clock signals of multiple phases may be generated, for example, by multi-phase oscillator 101. The frequency of multi-phase oscillator 101 may be calibrated according to the frequency of crystal oscillator 105.

In step 704, an initial injection signal is sent to crystal oscillator 105, for example, by control circuit 102. In some embodiments, the initial injection signal was provided by multi-phase oscillator 101. In some other embodiments, the initial injection signal was provided from other signal sources. In some embodiments, control circuit 102 is configured to send the initial injection signal to drive circuit 104 and set the initial injection signal at a high level. Drive circuit 104 is turned on when the initial injection signal is set at a high level. Then drive circuit 104 injects the initial injection signal to crystal oscillator 105. In some embodiments, the crystal oscillator 105 is a negative-feedback oscillation circuit that generates feedback signals, for example, a sine-wave feedback signal.

In step 706, the feedback signal from crystal oscillator 105 is received, for example, by phase selection circuit 103. In some embodiments, the sine-wave feedback signal is converted to a square-wave feedback clock signal that includes start rising edges by comparator 301.

In step 708, the candidate clock signals are sent to phase selection circuit 103, for example, by multi-phase oscillator 101.

In step 710, a periodical injection signal is sent to phase selection circuit 103, for example, by control circuit 102. In some embodiments, the periodical injection signal is provided to control circuit 102 by multi-phase oscillator 101. The control circuit 102 set the periodical injection signal at a high level and send the periodical injection signal to phase selection circuit 103 and drive circuit 104. Drive circuit 104 is turned on.

In step 712, a clock signal is selected from candidate clock signals, for example, by phase selection circuit 103. In some embodiments, after receiving the high-level periodical injection signal, counter 302 is triggered by the first upcoming rising edge of the square-wave feedback clock signal to start to count the upcoming rising edges of candidate clock signals from 1 to L, where the L-th candidate clock signal is the clock signal to be selected from candidate clock signals. The L-th clock signal is the clock signal with a phase difference from the square-wave feedback clock signal that is most close to the desired phase shifting. In some embodiments, in consideration of the delay caused by circuit components, the phase-shifting may be set to 90 degrees. In some embodiments, a value of phase-shifting other than 90 degrees according to the specific circuit can be set. When the phase shifting is set to 90 degrees, the L-th candidate clock signal satisfies the inequality: $(L-1)*360/2N \leq 90° \leq L*360/2N$. In some embodiments, index circuit 303 is configured to set the selected clock signal at a high level then send the selected clock signal to multiplexer 304; multiplexer 304 is configured to send the selected clock signal to drive circuit 104.

In step 714, the selected clock signal is injected to crystal oscillator 105 for a period of time, for example, by drive circuit 104. In some embodiments, the phase selection and signal injection steps (steps 712 and 714) can be repeated several times. For instance, every time phase selection circuit 103 is configured to select a clock signal from the candidate clock signals, drive circuit 104 is configured to inject the selected clock signal into the crystal oscillator 105, and control circuit 102 is configured to control the time period of the injection. Control circuit 102 is configured to control the period and times of injecting the periodical injection signals. The time duration of drive circuit 104 to be on and off is adjusted and determined by control circuit 102. In some embodiments, the higher the frequency calibration accuracy of multi-phase oscillator 101, the longer the injection time to crystal oscillator 105 each time can be. When the frequency of multi-phase oscillator 101 is close to crystal oscillator 105, the phase error is less easy to accumulate. Therefore, the injection time can be longer each time, and fewer times of injection is needed.

Figure 4:
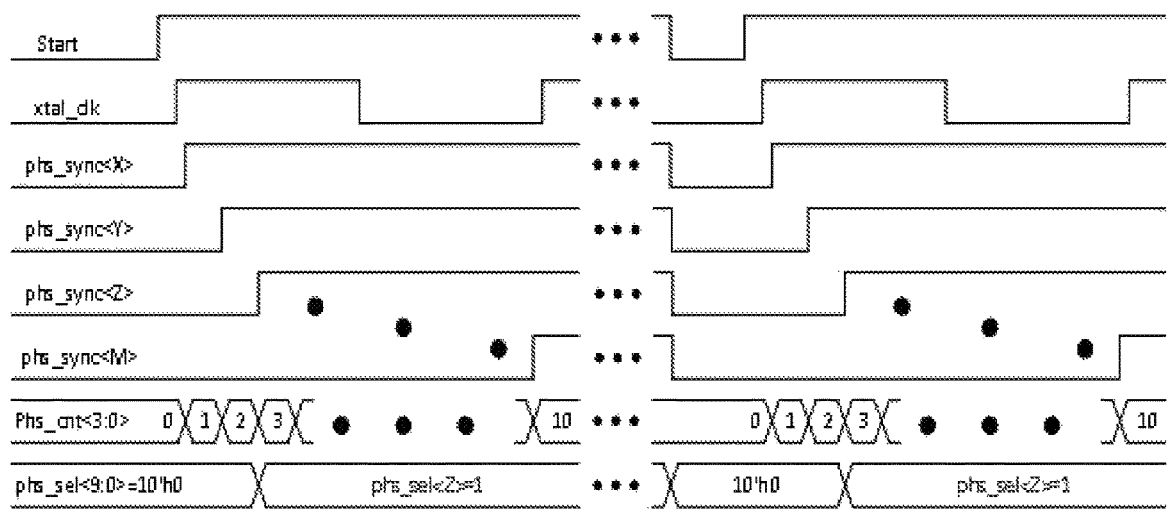
FIG. 4 is a sequence diagram illustrating the signals of a phase selection circuit in accordance with some embodiments.

FIG. 4 is a sequence diagram illustrating the signals of a phase selection circuit in accordance with some embodiments. As illustrated in FIG. 4, the sequence diagram 400 illustrates multi-phase oscillator 101 is a 5-stage ring oscillator which generates 10 candidate clock signals phs<9:0>. The candidate clock signals are with phases equally spaced at 36 degrees. When control circuit 102 outputs start a periodical injection signal at a high level, the first following rising edge of the square-wave feedback clock signal from comparator 301 triggers counter 302 to start to count upcoming rising edges of candidate clock signals. The $3^{rd}$ upcoming candidate clock signal is selected since the phase difference between the $3^{rd}$ upcoming candidate clock signal and the square-wave feedback clock signal is between 72° and 108°. In some embodiments, index circuit 303 is configured to set the selected clock signal at a high level, and multiplexer 304 is configured to send the selected clock signal to drive circuit 104.

In some embodiments, drive circuit 104 is coupled between phase selection circuit 103 and crystal oscillator 105. Drive circuit 104 injects the selected clock signal to crystal oscillator 105 to inject into crystal oscillator 105. Drive circuit 104 is also coupled to control circuit 102. Control circuit 102 sends an initial injection signal or periodical injection signal to drive circuit 104. When control circuit 102 sets the initial injection signal or periodical injection signal at a low level, drive circuit 104 is turned off, and crystal oscillator 105 sends a feedback signal to phase selection circuit 103. When control circuit 102 sets the initial injection signal or periodical injection signal at a high level, drive circuit 104 is turned on, and drive circuit 104 injects the selected clock signal to crystal oscillator 105.

Figure 6:
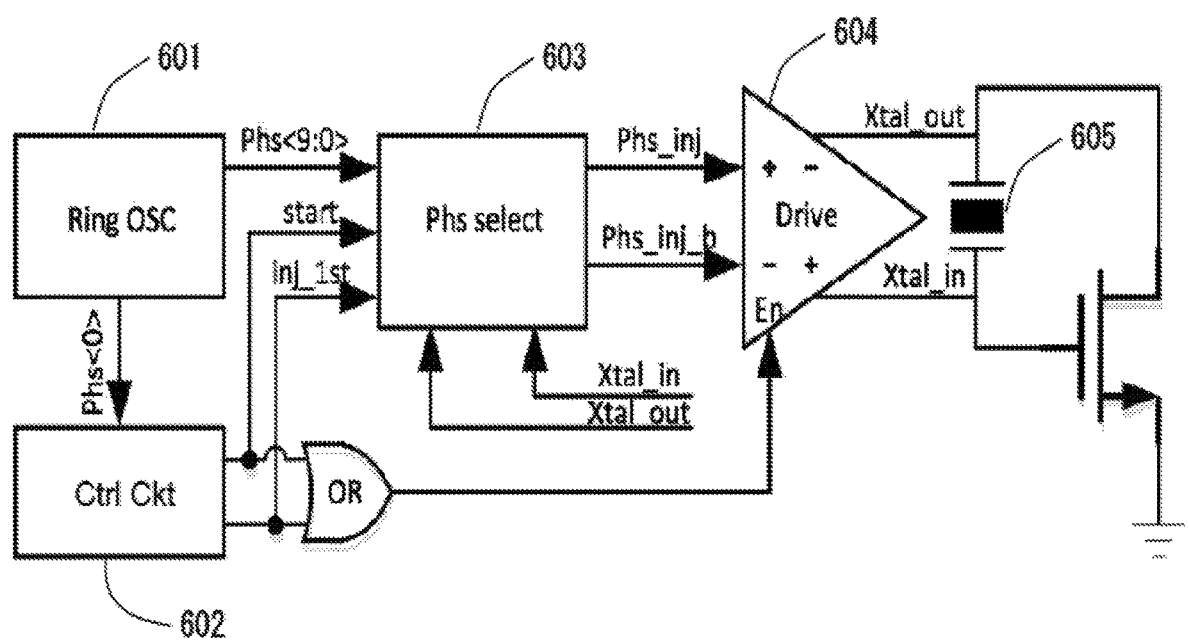
FIG. 6 is a block diagram illustrating an exemplary oscillation circuit with a 5-stage ring oscillator to start a crystal oscillator in accordance with some embodiments.

FIG. 6 is a block diagram illustrating an exemplary oscillation circuit with a 5-stage ring oscillator to start a crystal oscillator in accordance with some embodiments. Ring oscillator 601 generates candidate clock signals of 10 phases. The clock signals are with phases equally spaced at 36 degrees. Ring oscillator 601 is configured to send one candidate clock signal Phs<0> to control circuit 602. Control circuit 602 is first configured to generate an initial injection signal inj_1st (the Phs<0>) and maintain it at a high level for a period of time T1. During T1, phase selection circuit 603 is configured to determine Phs<0> as an injection signal, and drive circuit 604 is configured to inject the Phs<0> signal to the two ends of crystal oscillator 605. Therefore, the initial current of crystal oscillator 605 is boosted to a certain level. After the injection of the initial injection signal inj_1st, control circuit 602 is configured to generate a periodical injection signal "Start." When the Start signal is set at a high level, phase selection circuit 603 is configured to select a candidate clock signal with proper phase, and at the same time, the Start signal is configured to turn on drive circuit 604, then drive circuit 604 is configured to inject the selected clock signal to crystal oscillator 605. When the Start signal finishes, the drive circuit 604 is configured to turn off, and the phase selection circuit 603 is configured to be reset. When the Start signal is set at a high level again next time, phase selection circuit 603 is configured to select a candidate clock signal again, and drive circuit 604 is turned on and is configured to inject the selected clock signal to crystal oscillator 605 again. Control circuit 602 is configured to determine the period and times of the Start signal injection. Control circuit 602 is configured to finish working after the Start signal has been set at a high level for a certain time.

Figure 8:
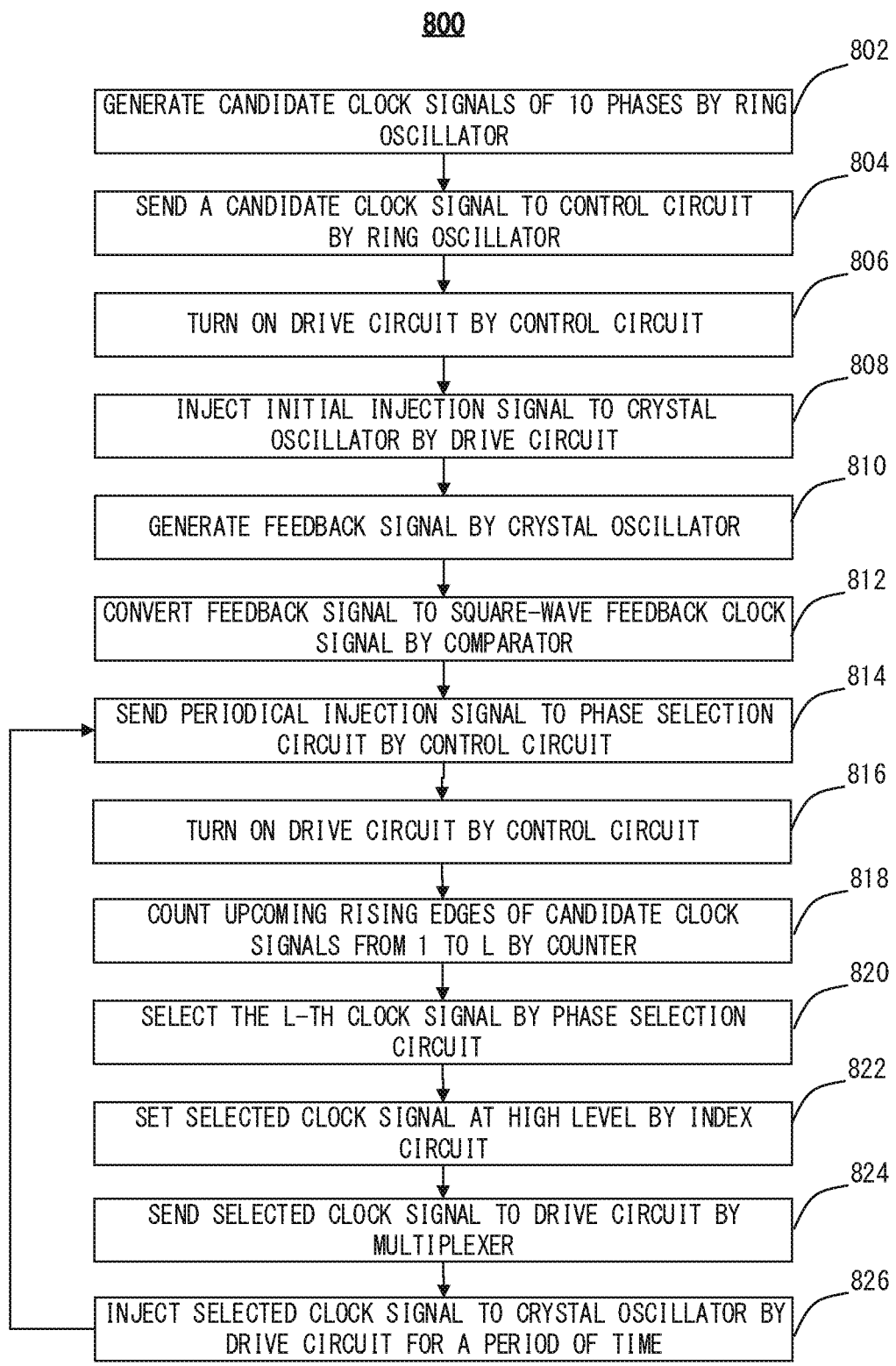
FIG. 8 is a flow chart illustrating an exemplary method for starting a crystal oscillator by a 5-stage ring oscillator in accordance with some embodiments.

FIG. 8 is a flow chart illustrating an exemplary method for starting a crystal oscillator by a 5-stage ring oscillator in accordance with some embodiments. Method 800 can be performed by processing logic that can include hardware (e.g., circuitry, deSRdicated logic, programmable logic, microcode, etc.), software (e.g., instructions executed on a processing device), or a combination thereof. It is to be appreciated that not all operations may be needed to perform the disclosure provided herein. Further, some of the operations may be performed simultaneously, or in a different order than shown in FIG. 8, as will be understood by a person of ordinary skill in the art.

Method 800 shall be described with reference to FIGS. 3, 4, and 6. However, method 800 is not limited to that exemplary embodiment. In method 800, the start of a crystal oscillator 605 is conducted by oscillation circuit 600.

Starting at step 802, candidate clock signals of multiple phases may be generated, for example, by a 5-stage ring oscillator 601. Ring oscillator 601 includes 5 differential delay units, and the candidate clock signals are of 10 phases. The clock signals are with phases equally spaced at 36 degrees. The frequency of ring oscillator 601 can be adjusted by adjusting the delay time of the 5 differential delay units.

In step 804, an initial injection signal is sent to crystal oscillator 605. In some embodiments, one of the candidate clock signals is provided as the initial injection signal by ring oscillator 601. In some other embodiments, the initial injection signal was provided from other signal sources.

In step 806, control circuit 602 is configured to send the initial injection signal to drive circuit 604 and set the initial injection signal at a high level. Drive circuit 604 is turned on when the initial injection signal is set at a high level.

In step 808, drive circuit 604 is configured to inject the initial injection signal to crystal oscillator 605. In some embodiments, crystal oscillator 605 is a negative-feedback oscillation circuit that generates feedback signals, for example, a sine-wave feedback signal.

In step 810, a feedback signal is generated by crystal oscillator 605. Crystal oscillator 605 is configured to send the feedback signal to phase selection circuit 603.

In step 812, feedback signal from crystal oscillator 605 is received, for example, by phase selection circuit 603. In some embodiments, phase selection circuit 603 can be the same as phase selection circuit 300, which includes comparator 301, counter 302, index circuit 303, and multiplexer 304. In some embodiments, the sine-wave feedback signal is converted to a square-wave feedback clock signal that includes start rising edges by a comparator 301.

In step 814, a periodical injection signal is sent to phase selection circuit 603, for example, by control circuit 602. In some embodiments, the periodical injection signal is provided to control circuit 602 by ring oscillator 601. The control circuit 602 sets the periodical injection signal at a high level and sends the periodical injection signal to phase selection circuit 603 and drive circuit 604.

In step 816, the drive circuit 604 is turned on once receiving the periodical injection signal at a high level from control circuit 602.

In step 818, after receiving the high-level periodical injection signal, counter 302 is triggered by the first upcoming rising edge of the square-wave feedback clock signal to start to count the upcoming rising edges of candidate clock signals from 1 to L, where the L-th candidate clock signal is the clock signal to be selected from candidate clock signals. The L-th clock signal is the clock signal with a phase difference from the square-wave feedback clock signal that is most close to the desired phase shifting. In some embodiments, in consideration of the delay caused by circuit components, the phase-shifting may be set to 90 degrees. When the phase shifting is set to 90 degrees, the L-th candidate clock signal satisfies the inequality: $(L-1)*360/2N \leq 90° \leq L*360/2N$. In this embodiment, N equals 5, and L equals 3.

In step 820, the $3^{rd}$ upcoming candidate clock signal is selected, for example, by phase selection circuit 603, since the phase difference between the $3^{rd}$ upcoming candidate clock signal and the square-wave feedback clock signal is between 72° and 108°.

In step 822, the selected clock signal is set at a high level, for example, by index circuit 303.

In step 824, the selected clock signal is sent to drive circuit 604, for example, by multiplexer 304.

In step 826, the selected clock signal is injected to crystal oscillator 605 for a period of time, for example, by drive circuit 604. In some embodiments, the phase selection and signal injection steps (steps 814-826) can be repeated for several times. For instance, every time phase selection circuit 603 is configured to select a clock signal from the candidate clock signals, drive circuit 604 is configured to inject the selected clock signal into the crystal oscillator 605, and control circuit 602 is configured to control the time period of the injection. Control circuit 602 is configured to control the period and times of injecting the periodical injection signals. The time duration of drive circuit 604 to be on and off is also adjusted and determined by control circuit 602. In some embodiments, the higher the frequency calibration accuracy of ring oscillator 601, the longer the injection time to crystal oscillator 605 each time can be. When the frequency of the ring oscillator 601 is calibrated to be close to the crystal oscillator 605, the phase error is less easy to accumulate. Therefore, the injection time can be longer each time, and fewer times of injection is needed.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure or the appended claims in any way.

While the present disclosure has been described herein with reference to exemplary embodiments for exemplary fields and applications, it should be understood that the present disclosure is not limited thereto. Other embodiments and modifications thereto are possible, and are within the scope and spirit of the present disclosure. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

The breadth and scope of the present disclosure should not be limited by any of the above-described exemplary embodiments, but should be defined only in accordance with the following claims and their equivalents.

What is claimed is:

1. An oscillation circuit, comprising:
   a crystal oscillator;
   a multi-phase oscillator configured to generate candidate clock signals of multiple phases;
   a phase selection circuit coupled to the multi-phase oscillator and configured to select a clock signal of proper phase from the candidate clock signals to be injected to the crystal oscillator;
   a drive circuit coupled to the phase selection circuit and the crystal oscillator and configured to receive the selected clock signal from the phase selection circuit and inject the selected clock signal to the crystal oscillator; and
   a control circuit coupled to the drive circuit and configured to control a time period for which the drive circuit injects the selected clock signal to the crystal oscillator.

2. The oscillation circuit of claim 1, wherein the phase selection circuit comprises:
   a comparator configured to convert a feedback signal from the crystal oscillator to a square-wave feedback clock signal, wherein the square-wave feedback clock signal comprises a start rising edge;
   a counter coupled to the comparator and configured to start to count upcoming rising edges of the candidate clock signals from 1 to L in response to receiving the start rising edge, wherein L is a natural number, and the L-th candidate clock signal is the selected clock signal;
   an index circuit coupled to the counter and configured to set the selected clock signal at a high level; and
   a multiplexer coupled to the index circuit and the drive circuit and configured to send the selected clock signal to the drive circuit.

3. The oscillation circuit of claim 2, wherein
   the control circuit is further configured to output an initial injection signal to the drive circuit, and the drive circuit is turned on in response to receiving the initial injection signal and further configured to send the initial injection signal to the crystal oscillator; and
   the crystal oscillator is coupled to the phase selection circuit and configured to generate the feedback signal in response to receiving the initial injection signal and send the feedback signal to the phase selection circuit.

4. The oscillation circuit of claim 2, wherein the multi-phase oscillator is an N-stage ring oscillator configured to generate the candidate clock signals with phases equally spaced at 360/2N degree, where N is an odd number.

5. The oscillation circuit of claim 4, wherein $$\frac{(L-1) \times 360°}{2N} \leq 90° \leq \frac{L \times 360°}{2N}.$$

6. The oscillation circuit of claim 3, wherein the multiphase oscillator is configured to provide one of the candidate clock signals to the control circuit as the initial injection signal.

7. The oscillation circuit of claim 1, wherein
the control circuit is further coupled to the phase selection circuit and configured to output a periodical injection signal to the phase selection circuit; and
the phase selection circuit is further configured to start to select the clock signal from the candidate clock signals in response to receiving the periodical injection signal.

8. The oscillation circuit of claim 7, wherein
the control circuit is further configured to output the periodical injection signal to the drive circuit,
the drive circuit is turned on in response to receiving the periodical injection signal and further configured to start to inject the selected clock signal to the crystal oscillator, and
the control circuit is configured to control a number of times and a period of each time for outputting the periodical injection signal.

9. The oscillation circuit of claim 7, wherein the multiphase oscillator is configured to provide one of the candidate clock signals to the control circuit as the periodical injection signal.

10. A method for starting a crystal oscillator, comprising:
generating candidate clock signals of multiple phases;
sending an initial injection signal to the crystal oscillator that generates a feedback signal from the crystal oscillator;
receiving the feedback signal from the crystal oscillator;
selecting a clock signal of proper phase from the candidate clock signals based on the feedback signal; and
injecting the selected clock signal to the crystal oscillator for a period of time.

11. The method of claim 10, wherein selecting the clock signal further comprises:
converting the feedback signal to a square-wave feedback clock signal comprising a start rising edge;
starting to count upcoming rising edges of candidate clock signals from 1 to L in response to receiving the start rising edge, wherein L is a natural number, and L-th candidate clock signal is the selected clock signal; and
setting the selected clock signal at a high level to be injected to the crystal oscillator.

12. The method of claim 11, wherein the candidate clock signals are generated by an N-stage ring oscillator with phases equally spaced at 360/2N degree, where N is an odd number.

13. The method of claim 12, wherein $$\frac{(L-1) \times 360°}{2N} \leq 90° \leq \frac{L \times 360°}{2N}.$$

14. The method of claim 10, wherein selecting the clock signal further comprises starting to select the clock signal after receiving a periodical injection signal.

15. The method of claim 14, further comprising controlling a number of times and a period of each time for the periodical injection signal to be received.

16. A phase selection circuit configured to select a clock signal from a plurality of candidate clock signals to start a crystal oscillator, comprising:
a comparator configured to convert a feedback signal from the crystal oscillator to a square-wave feedback clock signal, wherein the square-wave feedback clock signal comprises a start rising edge;
a counter coupled to the comparator and configured to start to count upcoming rising edges of the candidate clock signals from 1 to L in response to receiving the start rising edge, wherein L is a natural number, and the L-th candidate clock signal is the selected clock signal;
an index circuit coupled to the counter and configured to set the selected clock signal at a high level; and
a multiplexer coupled to the index circuit and a drive circuit and configured to send the selected clock signal to the drive circuit to inject into the crystal oscillator.

17. The phase selection circuit of claim 16, wherein
a control circuit is configured to output an initial injection signal to the crystal oscillator; and
the crystal oscillator is configured to generate the feedback signal in response to receiving the initial injection signal and send the feedback signal to the phase selection circuit.

18. The phase selection circuit of claim 17, wherein the candidate clock signals are generated by an N-stage ring oscillator, and the candidate clock signals are 2N candidate clock signals with phases equally spaced at 360/2N degree.

19. The phase selection circuit of claim 18, wherein $$\frac{(L-1) \times 360°}{2N} \leq 90° \leq \frac{L \times 360°}{2N}.$$

20. The phase selection circuit of claim 18, wherein the N-stage ring oscillator is configured to provide one of the 2N candidate clock signals to the control circuit as the initial injection signal.

* * * * *